United States Patent
Vuono et al.

(10) Patent No.: US 10,144,078 B2
(45) Date of Patent: Dec. 4, 2018

(54) METHOD FOR CLEANING AN ELECTRONIC CIRCUIT BOARD

(71) Applicant: Raytheon Company, Waltham, MA (US)

(72) Inventors: William R. Vuono, Lewisville, TX (US); William D. Beair, Carrollton, TX (US)

(73) Assignee: RAYTHEON COMPANY, Waltham, MA (US)

( * ) Notice: Subject to any disclaimer, the term of this patent is extended or adjusted under 35 U.S.C. 154(b) by 0 days.

(21) Appl. No.: 15/876,527

(22) Filed: Jan. 22, 2018

(65) Prior Publication Data

US 2018/0141144 A1 May 24, 2018

Related U.S. Application Data

(62) Division of application No. 14/340,984, filed on Jul. 25, 2014, now Pat. No. 9,902,006.

(51) Int. Cl.
| | |
|---|---|
| *H05K 7/10* | (2006.01) |
| *H05K 7/12* | (2006.01) |
| *B23K 1/20* | (2006.01) |
| *B23K 1/00* | (2006.01) |
| *H05K 1/02* | (2006.01) |
| *H05K 3/26* | (2006.01) |
| *H05K 3/28* | (2006.01) |
| *H05K 3/34* | (2006.01) |

(52) U.S. Cl.
CPC ............ *B23K 1/206* (2013.01); *B23K 1/0016* (2013.01); *H05K 1/0272* (2013.01); *H05K 3/26* (2013.01); *H05K 3/288* (2013.01); *H05K 3/3452* (2013.01); *H05K 2203/041* (2013.01); *H05K 2203/0445* (2013.01)

(58) Field of Classification Search
CPC ........ H05K 1/111; H05K 1/141–1/144; H05K 2201/10734; H05K 3/284
USPC .......... 361/760–764, 772–774; 174/259–264
See application file for complete search history.

(56) References Cited

U.S. PATENT DOCUMENTS

| | | |
|---|---|---|
| 5,706,178 A | 1/1998 | Barrow |
| 5,778,913 A | 7/1998 | Degani et al. |
| 7,416,106 B1 | 8/2008 | Downes et al. |
| 7,465,885 B2 | 12/2008 | Chi et al. |
| 7,791,211 B2 | 9/2010 | Chen et al. |
| 8,228,682 B1 | 7/2012 | Zohni et al. |
| 8,372,792 B2 | 2/2013 | Tanaka et al. |
| 8,496,159 B2 | 7/2013 | Feger et al. |
| RE44,562 E | 10/2013 | Pendse et al. |
| RE44,608 E | 11/2013 | Pendse et al. |

(Continued)

FOREIGN PATENT DOCUMENTS

| | | |
|---|---|---|
| CN | 103157873 A | 6/2013 |
| EP | 0015004 B1 | 5/1984 |

(Continued)

*Primary Examiner* — Tuan T Dinh
(74) *Attorney, Agent, or Firm* — Cantor Colburn LLP (57) ABSTRACT

A method for cleaning an electronic circuit board is disclosed. The electronic circuit board is provided with a substrate layer and a copper layer. A solder mask is applied to the electronic circuit board and a channel is formed in the solder mask. The channel includes an inlet and an outlet. A component is affixed to the electronic circuit board over the channel and cleaning fluid is passed through the channel to remove residual solder flux from between the component and the electronic circuit board.

13 Claims, 5 Drawing Sheets

(56) References Cited

U.S. PATENT DOCUMENTS

| | | |
|---|---|---|
| 2005/0067177 A1 | 3/2005 | Saito et al. |
| 2006/0047014 A1 | 3/2006 | Hopper et al. |
| 2008/0235941 A1 | 10/2008 | Chow |
| 2009/0163615 A1 | 6/2009 | Halahmi et al. |
| 2011/0304016 A1 | 12/2011 | Nakamura et al. |
| 2014/0131889 A1 | 5/2014 | Kim et al. |

FOREIGN PATENT DOCUMENTS

| | | |
|---|---|---|
| EP | 0382936 A2 | 8/1990 |
| EP | 0541914 A1 | 5/1993 |
| EP | 0615678 B1 | 7/1997 |
| EP | 0999007 A1 | 5/2000 |
| EP | 2408284 A1 | 1/2012 |

METHOD FOR CLEANING AN ELECTRONIC CIRCUIT BOARD

CROSS REFERENCE TO RELATED APPLICATIONS

The present application is a divisional application of U.S. patent application Ser. No. 14/340,984, filed Jul. 25, 2014, the contents of which are incorporated by reference herein in their entirety.

BACKGROUND

The present disclosure relates generally to an apparatus to facilitate cleaning electronic circuit boards and, more particularly, to an electronic circuit board including passages for cleaning residue after solder operations.

The use of conventional solder masks in the manufacture of electronic circuit boards can result in a substantial buildup of flux residue after the solder reflow process. Electronic circuit boards manufactured with such conventional solder masks, particularly electronic circuit boards for use with components with low standoff heights, can entrap flux underneath attached components. In addition, conventional solder masks and accompanying cleaning methods often require time-consuming cleaning methods that may not adequately remove flux residue.

SUMMARY

According to one embodiment of the present disclosure, a method for fabricating an electronic circuit board having a base substrate layer and a copper layer over the base substrate layer, the method comprising: applying a solder mask to the base substrate layer and the copper layer; forming a channel in the solder mask, the channel having an inlet and an outlet; affixing a component to the copper layer, wherein the component is disposed above the channel such that the inlet and the outlet extend beyond the component; and passing a fluid through the channel.

According to another embodiment of the present disclosure, a method for cleaning an electronic circuit board having a base substrate layer, a copper layer over the base substrate layer, a solder mask formed over the base substrate layer and the copper layer, and a component affixed to the copper layer and disposed over a channel formed in the solder mask, the channel including an inlet that extends beyond one side of the component and an outlet that extends beyond an opposite side of the component, the method comprising: directing a cleaning solution into the channel via the inlet; and expelling the cleaning solution via the outlet of the channel to cleaning a region of the electronic circuit board underneath the component.

According to yet another embodiment of the present disclosure, an electronic circuit board, comprising: a base substrate layer; a copper layer over the base substrate layer; a solder mask formed over the base substrate layer and the copper layer; a component affixed to the copper layer and disposed over a channel formed in the solder mask, the channel including: a main channel portion formed in the solder mask; an inlet formed in the solder mask extending beyond the component at one end of the main channel portion; and an outlet formed in the solder mask extending beyond the component at an end of the main channel portion opposite the inlet.

DETAILED DESCRIPTION

The present disclosure describes particular embodiments including an apparatus and method for cleaning electronic circuit boards.

As used herein, an "electronic circuit board" includes, but is not limited to, printed circuit boards and other electronic products formed in a similar manner to printed circuit boards described in a manner herein.

As used herein, a "component" includes, but is not limited to, devices that may be affixed to a printed circuit board or any other suitable electronic product, such as capacitors, resistors, integrated circuits, processors, logic chips, other chips, or other devices. Such components may be affixed and electrically connected to the electronic circuit board via soldering. A component may have a standoff height of about ½ mil (12.7 micrometers) resulting in only ½ mil (12.7 micrometers) clearance between the component and the underlying board.

Printed circuit boards mechanically support and electrically connect electronic components using conductive traces, pads and other features etched from copper sheets laminated onto a non-conductive substrate. A printed circuit board includes a non-conductive base laminate, also known as a substrate. Conductive traces, pads, and other features are etched from copper sheets and are laminated onto the substrate. The printed circuit board is then covered with a solder mask. The solder mask is a 1-1.5 mil (25.4-38.1 micrometers) thick coating that covers areas that are not intended to receive solder. Solder masks traditionally expose copper pads while masking the conductive paths or traces. Solder masks may further mask other portions of the board that may need to be protected from solder. The solder mask may be formed by applying a photosensitive coating to the surface of the printed circuit board and exposing light to the coating through a solder mask image film to develop the coating. The unexposed areas are then removed, leaving the solder mask as designed. The solder mask and the accompanying solder mask image film may be designed using computer aided design.

After the solder mask is applied and the board is finalized, components may be affixed to the board using the pads created on the board. Components are positioned and then soldered to the board. After the components are affixed with solder, residual solder flux may remain. Boards may be cleaned with the use of cleaning equipment that utilize a pressure manifold or other batch cleaning methods. Residual solder flux, particularly residual solder flux underneath the components, may not be easily cleaned. Also, conventional cleaning methods may be time-consuming and/or not sufficient in cleaning solder residues from between the board and the components. Inadequate or incomplete cleaning underneath components can lead to a flux dam, flux gasketing, dendritic flux flow, metal migration, captive solder balls or other contamination or build up. Such contamination may be exacerbated by environmental conditions, such as moisture or humidity present during manufacture or use. This residue can cause corrosion, an electrical shortage, or otherwise undesirable performance.

As components and boards have become smaller, and the standoff between board and components have decreased, the need for improved cleaning methods has increased. In general, a standoff height may approach ½ mil (12.7 micrometers) of clearance. Additionally, the introduction of lead free solder has increased solder temperatures and compositions that may make residue harder to remove.

Figure 1:
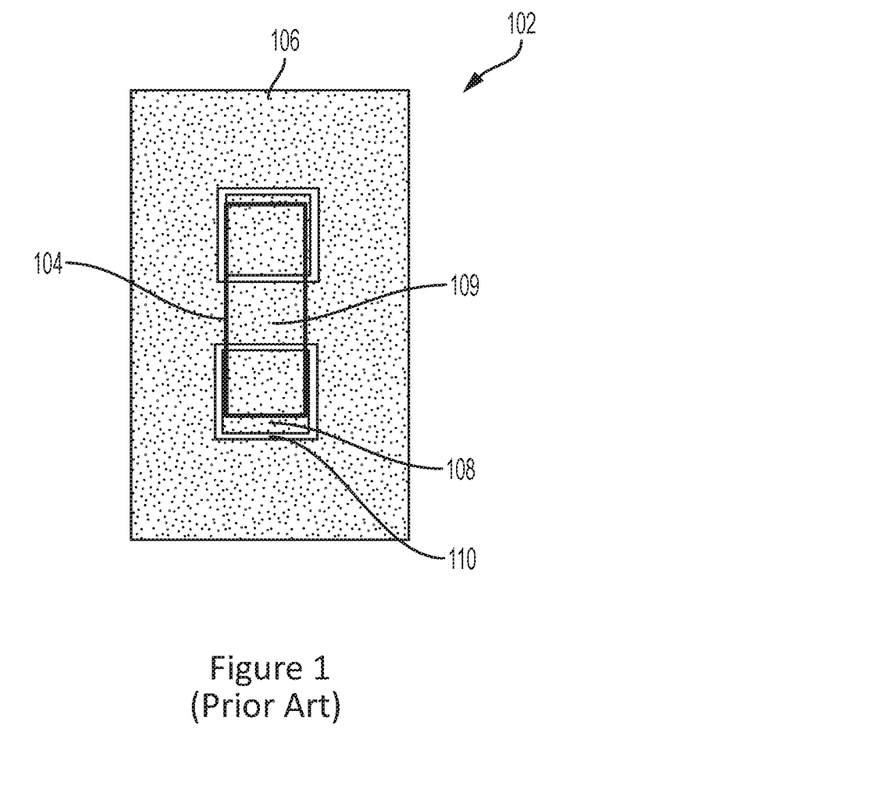
FIG. 1 is a schematic plan view of an electronic circuit board with a conventional solder mask.

FIG. 1 shows a conventional board 102 as known in the art. The conventional board 102 includes component 104, solder mask 106, solder pads 108, and an unmasked portion 110. The component 104 (shown as an outline to show underlying features) is attached to the board 102 via solder pads 108. Component 104 may be attached to board 102 using solder heated, for example, using a solder reflow oven. The solder mask 106 is present underneath component 104, notably in the region 109 between pads 108. Residual solder flux from the soldering process may build up between board 102 and component 104 and may not easily be removed. This residual flux build-up may be exacerbated as the standoff height of component 104 is reduced to bring component 104 closer to board 102.

Figure 2:
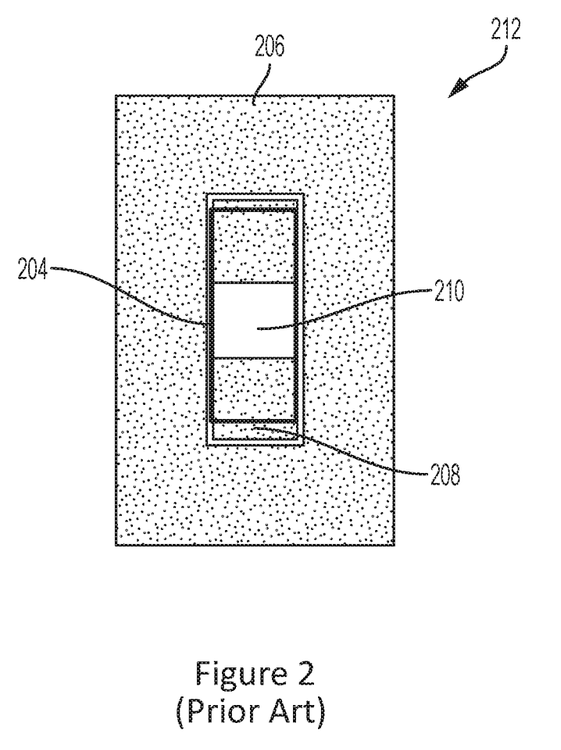
FIG. 2 is a schematic plan view of an electronic circuit board with a modified solder mask.

FIG. 2 shows another conventional board 212 as known in the art. Board 212 includes component 204, solder mask 206, solder pads 208, and an unmasked portion 210. The unmasked portion 210 disposed below component 204 extends between pads 208. Residual solder flux from the soldering process may build up between board 212 and component 204. Despite clearance between board 212 and component 204 provided by unmasked portion 210, cleaning solution (also referred to herein as "cleaning fluid") may not be able to sufficiently access the area between the solder mask 206 and the component 204 and residue may not easily be removed, leaving uncleansed, or partially cleaned solder residue.

Figure 3:
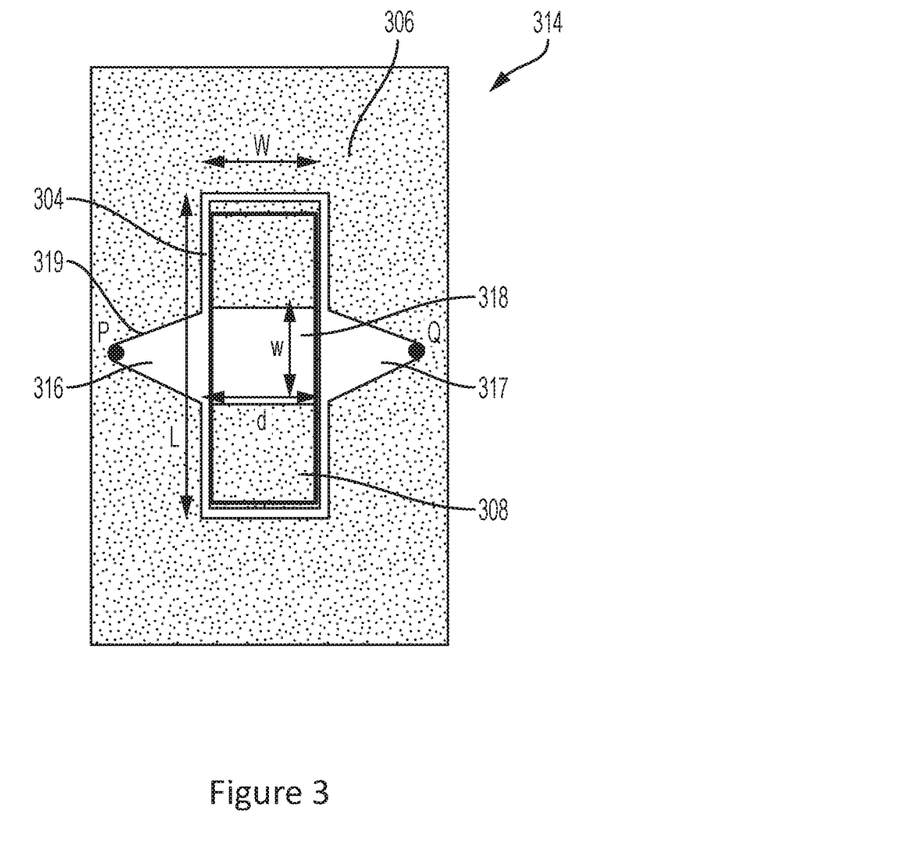
FIG. 3 is a schematic plan view of an electronic circuit board with a solder mask in accordance with an exemplary embodiment of the present invention.
Figure 4:
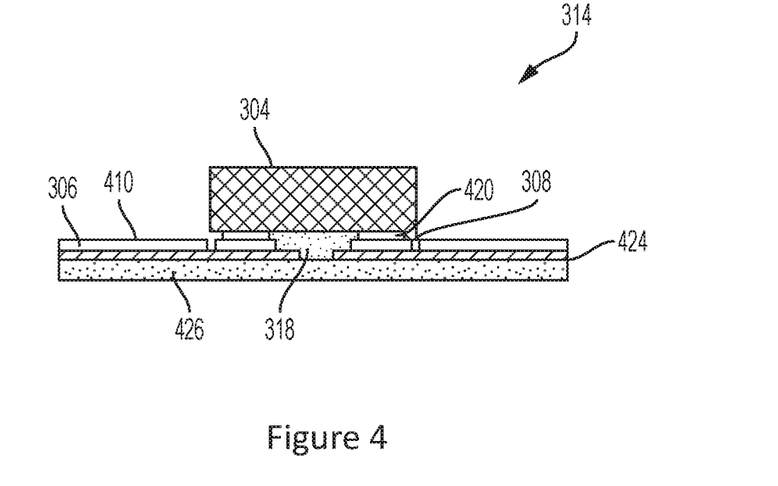
FIG. 4 is a cross sectional view of the electronic circuit board with a solder mask illustrated in FIG. 3.

FIGS. 3 and 4 show an illustrative board 314 including a solder mask 306 of the present invention. Board 314 includes a component 304, a solder mask 306, and pads 308. Board 314 further includes inlet 316, outlet 317, and channel 318 formed in a surface of the board 314.

As shown in FIG. 4, board 314 has a base substrate 426 that is a non-conductive layer that provides structure to the board 314 as well as a secure base layer for component 304, copper plate 424, and solder mask 306 to be affixed. Copper plate 424 is applied to base substrate 426 to form conductive paths, traces, and pads 308. Copper plate 424 electrically connects to component 304 when attached with solder 420. Further, copper plate 424 provides physical attachment points for component 304 and solder 420 by forming pads 308. Pads 308 are formed by application of copper plate 424. During solder operations, pads 308 receive solder 420 to structurally attach and electrically connect component 304 to copper plate 424 and to any other components (not shown) via conductive traces. Solder mask 306 is then applied to protect conductive paths or traces from shorting or generally receiving solder during the soldering process. The solder mask 306 is applied over the entire board 314. In an exemplary embodiment, channel 318 along with inlet 316 and outlet 317 are formed in solder mask 306 underneath desired components 304.

As previously discussed, residual solder flux and other residue may remain underneath component 304 after soldering. Further, solder balls may become entrapped under the component 304 due to the solder reflow process. After the component 304 is mounted to board 314, board 314 is cleaned. In order to facilitate cleaning, and referring to FIGS. 3 and 4, solder mask 306 has a channel 318 formed therein below component 304 between pads 308 in order to provide flow of a fluid underneath the component 304. In an exemplary embodiment, the fluid flows in a direction substantially perpendicular to a line connecting pads 308. In an exemplary embodiment, channel 318 has a generally rectangular shape of length d and width w. Walls of channel 318 are formed by the interior edges of pads 308 revealed by removing solder mask 306 in a selected area. As previously discussed, the shape of the solder mask 306 may be formed via computer aided design. In an exemplary embodiment, the length d of channel 318 is designed to be at least the width W of component 304 and the width w of channel 318 is designed to be defined by the interior edges of pads 308 to allow for a sufficient cleaning path underneath component 304. Further, channel 318 may scale with the length L and width W of such components 304 and associated pads 308.

The channel 318 allows for cleaning solution to flow underneath the component 304 to allow for chemical and mechanical cleaning of residual solder flux and entrapped solder balls from beneath component 304. In an exemplary embodiment, channel 318 allows for turbulent flow of the cleaning fluid as the cleaning fluid enters the channel 318. Further, in an exemplary embodiment, the channel 318 has a depth of about 1.5 mils to 2.5 mils (38.1-63.5 micrometers) below a surface 410 of the electronic circuit board 314, allowing for a total of 1-3 mils (25.4-76.2 micrometers) of clearance for cleaning solutions between component 304 and board 314.

Flow of cleaning fluid into channel 318 is facilitated by inlet 316 and outlet 317 which directs fluid into channel 318 and expels fluid out of channel 318, respectively. Inlet 316 and outlet 317 extend beyond the length of component 304 or array of components 304 to facilitate flow of cleaning solution into and out of channel 318. As shown in FIG. 3, solder mask 306 has an inlet 316 transitioning to channel 318 to allow flow of fluid into the channel and similarly an outlet 317 transitions out of channel 318 to allow fluid to flow out of channel 318. Inlet 316 and outlet 317 may be used interchangeably wherein inlet 316 may function as an outlet and outlet 317 may function as an inlet. Inlet 316 and outlet 317 may have a converging or diverging shape to direct flow, wherein the outermost point of either inlet 316 or outlet 317 is smaller than the width W of channel 318. In certain embodiments, inlet 316 may diverge from a starting point P to allow a cleaning fluid to be introduced to the full width of channel 318. A depth of the inlet 316 at point P may be substantially negligible, with the depth of the inlet 316 increasing to a depth of the channel 318 when moving from point P toward the channel 318. The depth of the inlet 316 may vary linearly with distance or according to a selected function that produces a selected fluid flow. Similarly, in certain embodiments, outlet 317 may converge to a point Q to expel a cleaning fluid and residual solder flux or other residue from the channel 318. A depth of the outlet 318 at point Q may be substantially negligible, with the depth of the outlet 318 increasing to a depth of the channel 318 when moving from point Q toward the channel 318. The depth may vary linearly with distance or according to a selected function. In certain embodiments, inlet 316 and outlet 317 have boundary edges 308 that do not interface with channel 318 or that are adjacent to channel 318. For these embodiments, the length of the boundary edges 319 may be substantially equal to the width w of corresponding channel 318 to ensure sufficient flow into channel 318. In an exemplary embodiment, inlet 316 and outlet 317 is formed in the shape of an equilateral triangle, wherein the sides of inlet 316 and outlet 317 are equal in length to the width w of channel 318. This type of configuration allows for the shape of inlet 316 and outlet 317 to scale appropriately with the size of channel 318. The shapes of inlet 316 and outlet 317 may be selected to allow for turbulent flow of the cleaning fluid to be created within channel 318 as flow transitions into the lower elevation of channel 318 from the higher elevation solder mask 306.

Inlet 316, outlet 317 and channel 318 are formed by forming a groove or slit in solder mask 306. The formation of inlet 316 and outlet 317 in conjunction with channel 318 allows for cleaning solution to be forced under component 304 to form a Jetting Zone of fluid underneath the component 304. The speed of the fluid in the channel 318 may be increased with respect to the speed of fluid flow in conventional cleaning methods, thereby reducing cleaning times over conventional cleaning methods. For example, cleaning may be achieved at a process speed of about 2 feet per minute, compared to conventional cleaning processes requiring a slower process speed of about 0.5 feet per minute, thereby reducing cleaning time by about 75%.

Figure 5:
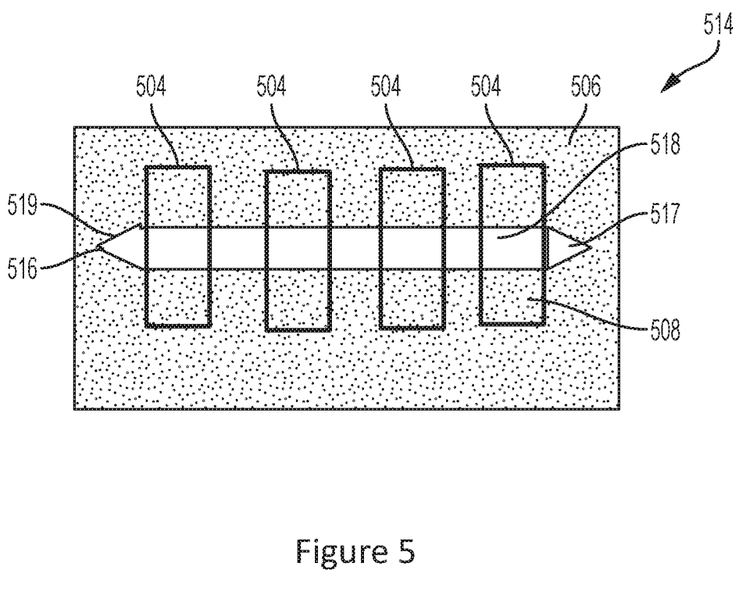
FIG. 5 is a schematic plan view of an electronic circuit board with a solder mask in accordance with an alternative embodiment of the present invention.

FIG. 5 is a schematic plan view of an electronic circuit board with a channel 518 extending beneath multiple components 504. The multiple components 504 may be aligned along a selected direction to form a row oriented along board 514. Such alignment of components 504 may streamline fabrication processes, reduce overall board 514 size, and increase production and operation efficiency. Channel 518 thus may be formed to extend under the multiple components 504 to allow fluid to flow underneath the multiple components 504. The inlet 516 and outlet 517 are thus formed at the beginning and end of the row of multiple components. Such formation of channel 518, inlet 516, and outlet 517 allows for the simplified formation of channel 518 under multiple components 504 where multiple channels may not be desirable.

The use of the terms "a" and "an" and "the" and similar referents in the context of describing the invention (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Exemplary embodiments of this invention are described herein, including the best mode known to the inventors for carrying out the invention. Variations of those embodiments may become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

What is claimed is:

1. A method for fabricating an electronic circuit board having a base substrate layer and a copper layer over the base substrate layer, the method comprising:
    applying a solder mask to the base substrate layer and the copper layer;
    forming a channel in the solder mask, the channel having:
        a main channel portion formed in the solder mask, wherein walls of the main channel portion are formed by interior edges of the copper pads and the main channel portion has a selected width,
        an inlet formed in the solder mask extending beyond the component at one end of the main channel portion, wherein the inlet is in a shape of an equilateral triangle having one side corresponding to the width of the main channel portion and two sides converging to a point, wherein a depth of the inlet is substantially negligible at the point and increases linearly to the depth of the main channel portion, and
        an outlet formed in the solder mask extending beyond the component at another end of the main channel portion opposite the inlet, wherein the outlet is in a shape of an equilateral triangle having one side corresponding to the width of the main channel portion and two sides converging to a point, wherein a depth of the inlet is substantially negligible at the point and increases linearly to the depth of the main channel portion;
    affixing a component to a pad formed on the copper layer, wherein the component is disposed above the channel such that the inlet and the outlet extend beyond the component; and
    passing a fluid through the channel.

2. The method of claim 1, wherein the channel is configured to have a clearance of at least 2 mils (50.8 micrometers) between a bottom of the channel and the component.

3. The method of claim 1, wherein the inlet and the outlet each have at least one edge that is the same length as a width of the channel.

4. The method of claim 1, wherein a shape of the inlet is configured to create turbulent flow in the channel.

5. The method of claim 1, wherein the channel is formed between a first solder pad and a second solder pad that connects the component to the copper layer.

6. The method of claim 1, further comprising affixing an at least one additional component to the copper layer, wherein the at least one additional component is disposed above the channel and the inlet and the outlet extend underneath the component and the at least one additional component.

7. A method for cleaning an electronic circuit board having a base substrate layer and a copper layer over the base substrate layer, the method comprising:
    forming a solder mask over the base substrate layer and the copper layer
    forming a channel in the solder mask, the channel having:
        a main channel portion formed in the solder mask, wherein walls of the main channel portion are formed by interior edges of the copper pads and the main channel portion has a selected width, an inlet formed in the solder mask extending beyond the component at one end of the main channel portion, wherein the inlet is in a shape of an equilateral triangle having one side corresponding to the width of the main channel portion and two sides converging to a point, wherein a depth of the inlet is substantially negligible at the point and increases linearly to the depth of the main channel portion, and an outlet formed in the solder mask extending beyond the component at another end of the main channel portion opposite the inlet, wherein the outlet is in a shape of an equilateral triangle having one side corresponding to the width of the main channel portion and two sides converging to a point, wherein a depth of the inlet is substantially negligible at the point and increases linearly to the depth of the main channel portion;

affixing a component to a pad formed on the copper layer and disposed over the channel;

directing a cleaning solution into the channel via the inlet; and expelling the cleaning solution via the outlet of the channel to clean a region of the electronic circuit board underneath the component.

8. The method of claim 7, wherein the channel is configured to have a clearance of at least 2 mils (50.8 micrometers) between a bottom of the channel and the component.

9. The method of claim 7, wherein the inlet and the outlet each have at least one edge that is the same length as a width of the channel.

10. The method of claim 7, wherein the inlet is configured to create turbulent flow in the channel.

11. The method of claim 7, wherein the channel is formed between a first solder pad and a second solder pad of the electronic circuit board and the component is attached to the first solder pad and the second pad to be disposed above the channel.

12. The method of claim 7, wherein the electronic circuit board further includes an at least one additional component attached to the copper layer, wherein the at least one additional component is disposed above the channel and the inlet and the outlet extend underneath the component and the at least one additional component.

13. The method of claim 7, wherein the region of the electronic circuit board underneath the component includes at least one solder ball to be expelled with the cleaning solution.

* * * * *